(12) United States Patent
Waelde

(10) Patent No.: US 10,837,819 B2
(45) Date of Patent: Nov. 17, 2020

(54) RADAR FILL LEVEL MEASUREMENT DEVICE COMPRISING A SYNCHRONIZING SIGNAL ON DIFFERENT LAYERS OF A PRINTED CIRCUIT BOARD

(71) Applicant: VEGA GRIESHABER KG, Wolfach (DE)

(72) Inventor: Steffen Waelde, Niedereschach (DE)

(73) Assignee: VEGA GRIESHABER KG, Wolfach (DE)

( * ) Notice: Subject to any disclaimer, the term of this patent is extended or adjusted under 35 U.S.C. 154(b) by 200 days.

(21) Appl. No.: 16/155,433

(22) Filed: Oct. 9, 2018

(65) Prior Publication Data
US 2019/0107429 A1 Apr. 11, 2019

(30) Foreign Application Priority Data
Oct. 6, 2017 (EP) .................................. 17195212

(51) Int. Cl.
| | | |
|---|---|---|
| G01F 23/284 | (2006.01) |
| G01S 7/03 | (2006.01) |
| H01P 5/08 | (2006.01) |
| H01Q 1/22 | (2006.01) |
| H03F 3/195 | (2006.01) |
| G01S 13/88 | (2006.01) |
| G01S 7/35 | (2006.01) |

(52) U.S. Cl.
CPC .............. *G01F 23/284* (2013.01); *G01S 7/03* (2013.01); *G01S 7/032* (2013.01); *G01S 7/35* (2013.01); *G01S 13/88* (2013.01); *H01P 5/08* (2013.01); *H01Q 1/225* (2013.01); *H01Q 1/2283* (2013.01); *H03F 3/195* (2013.01); *H03F 2200/294* (2013.01)

(58) Field of Classification Search
CPC combination set(s) only.
See application file for complete search history.

(56) References Cited

U.S. PATENT DOCUMENTS

| 5,420,591 | A | 5/1995 | Annee et al. |
| 9,910,133 | B2 | 3/2018 | Li et al. |
| 2004/0056667 | A1* | 3/2004 | Lutke ...................... H01Q 1/225 324/644 |
| 2007/0109178 | A1* | 5/2007 | Schultheiss ............. H01P 5/107 342/124 |
| 2011/0098970 | A1* | 4/2011 | Hug ....................... G01S 13/103 702/159 |

(Continued)

FOREIGN PATENT DOCUMENTS

| DE | 10 2016 101 318 A1 | 8/2016 |
| EP | 3 171 138 A1 | 5/2017 |

(Continued)

*Primary Examiner* — Mamadou L Diallo
(74) *Attorney, Agent, or Firm* — Oblon, McClelland, Maier & Neustadt, L.L.P.

(57) ABSTRACT

A radar fill level measurement device for recording the topology of a filling material surface in a container, comprising at least two radar chips. One of the radar chips generates a local oscillator signal which, in order to synchronize the two chips, is transmitted thereto by a high-frequency line arrangement. The high-frequency line arrangement is arranged on different layers of the printed circuit board substrate.

17 Claims, 19 Drawing Sheets

Fig. 9B

(56) References Cited

U.S. PATENT DOCUMENTS

| | | | | |
|---|---|---|---|---|
| 2012/0153969 A1* | 6/2012 | Eckert | .................... | H01P 5/087 |
| | | | | 324/637 |
| 2014/0242328 A1* | 8/2014 | Lopatin | .................. | G01F 23/24 |
| | | | | 428/119 |
| 2015/0156861 A1* | 6/2015 | Blodt | .................... | H05K 1/024 |
| | | | | 361/782 |
| 2015/0177373 A1* | 6/2015 | Boeck | .................... | G01S 7/006 |
| | | | | 342/52 |
| 2016/0178730 A1* | 6/2016 | Trotta | .................... | G01S 7/354 |
| | | | | 342/175 |
| 2017/0141453 A1 | 5/2017 | Waelde et al. | | |
| 2017/0241826 A1* | 8/2017 | Blodt | .................... | G01S 13/88 |
| 2018/0224525 A1* | 8/2018 | Cho | ........................ | G01S 7/292 |
| 2019/0101636 A1* | 4/2019 | Trotta | .................... | G01S 7/032 |

FOREIGN PATENT DOCUMENTS

| | | |
|---|---|---|
| WO | WO 2007/124860 A1 | 11/2007 |
| WO | WO 2014/135452 A1 | 9/2014 |
| WO | WO 2016/011407 A1 | 1/2016 |
| WO | WO 2016/202394 A1 | 12/2016 |

\* cited by examiner

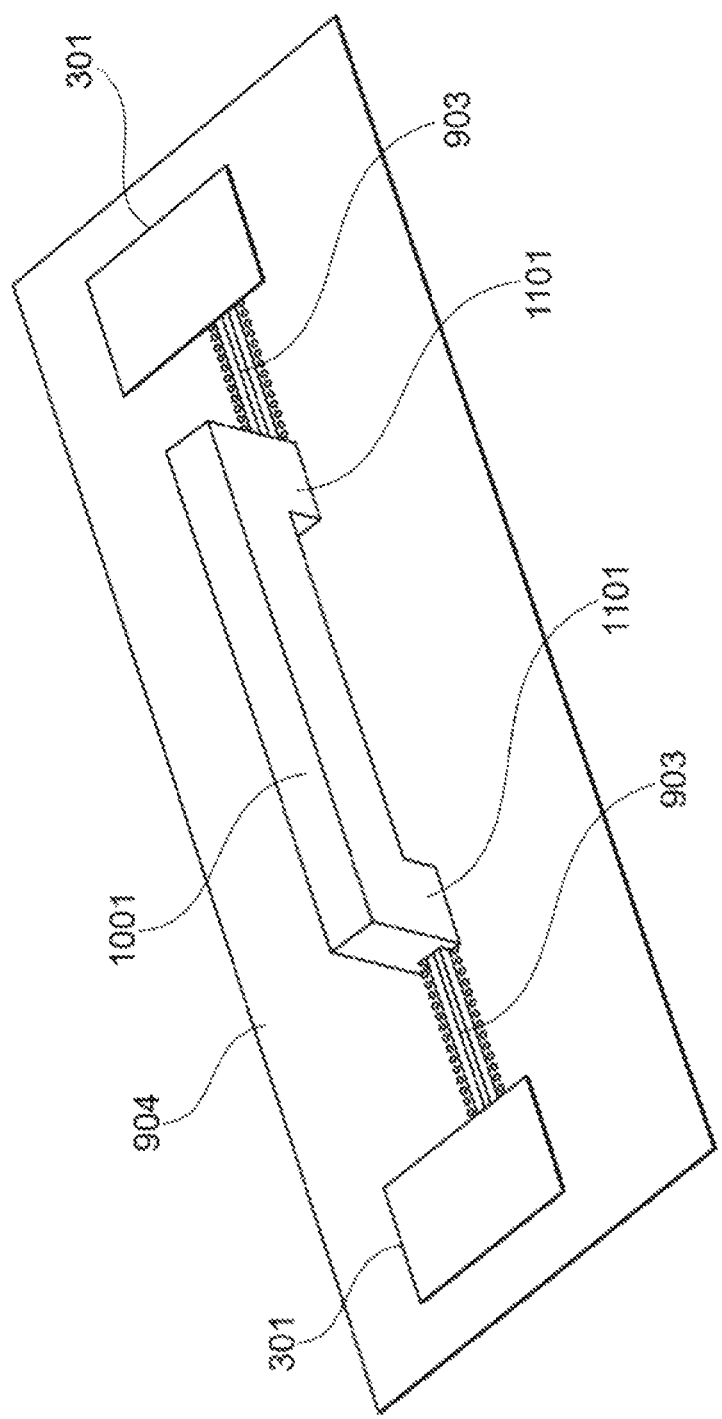

RADAR FILL LEVEL MEASUREMENT DEVICE COMPRISING A SYNCHRONIZING SIGNAL ON DIFFERENT LAYERS OF A PRINTED CIRCUIT BOARD

CROSS-REFERENCE TO RELATED APPLICATIONS

This application claims the benefit of the filing date of European Patent Application No. 17 195 212.0 filed on 6 Oct. 2017, the entire content of which is incorporated herein by reference.

FIELD

The invention relates to fill level measurement and to recording the topology of a filling material surface in a container. The invention relates in particular to a radar fill level measurement device for fill level measurement and/or for recording the topology of a filling material surface in a container.

BACKGROUND

Nowadays, radar fill level measurement devices are used for fill level measurement and for recording the topology of a filling material surface. In contrast with many other fields, the breakthrough for radar technology in fill level measurement was possible only once extremely small reflection signals could be recorded and processed by the electronics of measurement devices.

Modern fill level measurement devices and topology measurement devices which can record the exact shape of the surface of a filling material are characterized not only by a high transmission frequency which is typically in the gigahertz range, for example in the range of from 75 GHz to 85 GHz, but can also reliably process amplitude differences of the reflected signal in a range of up to 100 dB.

A monolithic microwave integrated circuit (MMIC) can be provided for generating and processing the high-frequency transmission signals in the range of 79 GHz. This module can comprise a plurality of transmission and reception channels (which are also referred to as radar channels in this application) so that the filling material surface can be scanned.

The more precisely the filling material surface has to be scanned, the more transmission and reception channels are required in order to achieve a high-quality image, and this is associated with a correspondingly large outlay for hardware and a correspondingly high energy requirement.

SUMMARY

It may be desirable to provide a radar fill level measurement device for measuring a fill level of a medium or the topology of a medium in a container.

A first aspect relates to a radar fill level measurement device designed for measuring a fill level of a medium in a container and/or for recording the topology of a filling material surface in a container. The radar fill level measurement device comprises a printed circuit board having a first layer and a second layer, and a first radar chip and a second radar chip that are each arranged on the first layer.

Both the first radar chip and the second radar chip can comprise one or more transmission channels for emitting one transmission signal in each case towards the filling material surface, and one or more reception channels for receiving the transmission signals reflected on the filling material surface. One or more of the transmission channels can also be designed as a combined transceiver channel.

The radar chips can in particular be microwave integrated circuits, which can also be referred to as a radar system-on-chip. A radar system-on-chip (RSoC) of this type is a highly integrated microwave circuit which comprises circuit components for digital functions and which, according to one embodiment, can integrate in a single radar chip the entire functionality of a conventional radar system for generating signals, processing signals and converting reception signals (i.e. reflected transmission signals) into digital form.

Each transmission channel can be designed to generate a high-frequency transmission signal having a frequency in the two-digit or three-digit gigahertz range, for example in the range of from 75 GHz to 85 GHz.

The first radar chip may be configured as master chip and comprises a first synchronization circuit designed for generating a high-frequency signal, which is generally a local oscillator signal of the radar chip. The high-frequency signal can be a frequency-divided signal, for example, that therefore has a lower frequency than the transmission signal emitted by the radar fill level measurement device. The high-frequency signal has a frequency of 40 GHz or 20 GHz, for example.

The second radar chip may be configured as slave chip and comprises a second synchronization circuit, and a high-frequency line arrangement is provided which is designed for transmitting the high-frequency signal from the first synchronization circuit to the second synchronization circuit and is provided for synchronizing the two radar chips. Dividing the frequency of the high-frequency signal allows the conductive track path to be simplified because the power loss decreases. The high-frequency signal can then be multiplied again before it is used for synchronizing the two radar chips, for example by means of a frequency multiplier arranged in the second synchronization circuit.

The high-frequency line arrangement comprises a first conductive track on the first layer, a second conductive track on the first layer and a high-frequency line arranged therebetween on the second layer and connected to the first and to the second conductive track by means of a via in each case.

According to an embodiment, said arrangement comprises a third conductive track.

According to an embodiment, the high-frequency line comprises a waveguide.

According to an embodiment, the first conductive track, the second conductive track and/or the third conductive track is a microstrip line or comprises at least one such component.

The high-frequency line arrangement for transmitting the high-frequency signal can comprise one, two or more different types of line which are arranged in series with one another, at least in part.

For example, the high-frequency line arrangement comprises a microstrip line, and also a waveguide, e.g. a rectangular waveguide or a circular waveguide, a coaxial conductor, a substrate integrated waveguide (SIW) and/or a coplanar line. Other types of planar line can also be provided.

The power loss can be further reduced by changing from one type of line to another, because the second type of line attenuates the high-frequency signal to a lesser degree.

The high-frequency line arrangement can also comprise a waveguide coupler for coupling the high-frequency signal from the first type of line into a waveguide (second type of line).

The high-frequency line arrangement is split up by means of one or more high-frequency power divider, for example, in order to synchronize a plurality of radar chips.

The two lines that begin at the high-frequency power divider and lead to the second synchronization circuit of two further radar chips can have the same signal propagation time required by the split high-frequency signal in order to reach the corresponding synchronization circuit of the corresponding radar chip.

Furthermore, a high-frequency amplifier (or a plurality thereof) designed for amplifying the high-frequency signal can be arranged in the high-frequency line arrangement.

The first radar chip may be designed as what is known as a master chip that generates a synchronization signal by means of which the further radar chip or radar chips, which are known as slave chips, are synchronized.

According to a further embodiment, the high-frequency signal is a high-frequency signal that is divided by an integer factor with respect to the transmission signal.

The amplifying power of the high-frequency amplifier or amplifiers arranged in the high-frequency line arrangement can be adjusted depending on the fill level, and/or depending, on how many radar chips are currently being used for fill level measurement, for example.

According to a further embodiment, the high-frequency amplifier has a useful frequency range of 30 GHz or of 60 GHz.

According to a further embodiment, an analog-to-digital converter is integrated in the first and/or in the second radar chip and designed for converting the reception signal into a digitized intermediate-frequency signal that originates from one or more transmission signals reflected on the filling material surface.

According to a further embodiment, at least two of the transmission channels each comprise an antenna connected thereto.

According to a further embodiment, the radar fill level measurement device is designed as an FMCW radar fill level measurement device that uses a frequency-modulated continuous-wave signal for measurement, each measurement cycle comprising at least one frequency sweep that has a starting frequency of 75 GHz and a maximum frequency of 85 GHz, for example.

According to a further embodiment, the high-frequency line arrangement comprises a first conductive track on a printed circuit board, a second conductive track on the printed circuit board and a waveguide arranged therebetween.

Moreover, the high-frequency line arrangement can comprise vias that are guided through the printed circuit board and are used to switch the top face of the printed circuit board such that parts of the high-frequency lane arrangement are attached to one side of the printed circuit board, and other parts of the high-frequency line arrangement are attached to the other, opposite side.

According to a further embodiment, the radar fill level measurement device is designed for recording the topology of a medium in a container.

According to a further embodiment, the first and the second radar chip are each based on BiCMOS technology. According to a further embodiment, the radar chips are based on SiGe technology. According to a further embodiment, the radar chips are based on HF CMOS technology and comprise high-frequency circuit parts for frequencies of 75 GHz and above.

According to a further embodiment, the high-frequency amplifier is a low-noise amplifier (LNA) that has a separate power supply.

According to an embodiment, the high-frequency amplifier is operated only in the linear range thereof. If necessary a plurality of high-frequency amplifiers can be provided in the high-frequency line arrangement.

Embodiments are described in the following with reference to the drawings. Where the same reference signs are used in the following description of the drawings, they denote the same or similar elements. The views in the drawings are schematic and not to scale.

BRIEF DESCRIPTION OF THE DRAWINGS

FIG. 11 shows a further high-frequency line arrangement having a waveguide.

DETAILED DESCRIPTION OF EMBODIMENTS

Figure 1A:
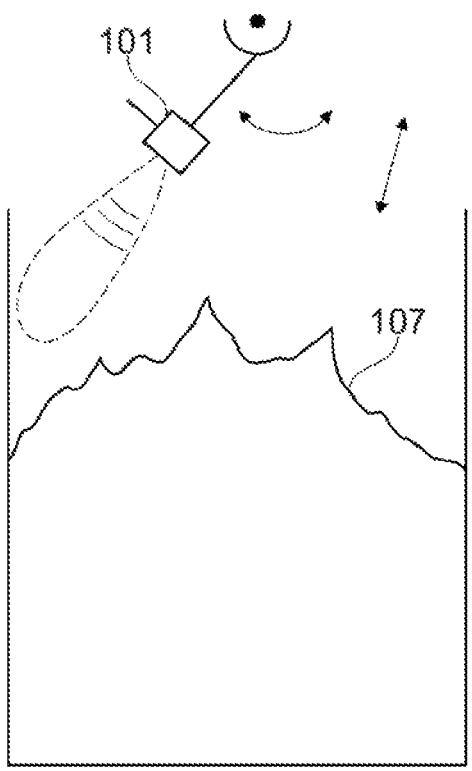
FIG. 1A shows a radar fill level measurement device that is installed in as container in order to record the topology of the surface of a filling material in the container.

FIG. 1A shows a radar fill level measurement device 101 that is installed in a container in order to record the topology of the surface of a filling material in the container.

Figure 4A:
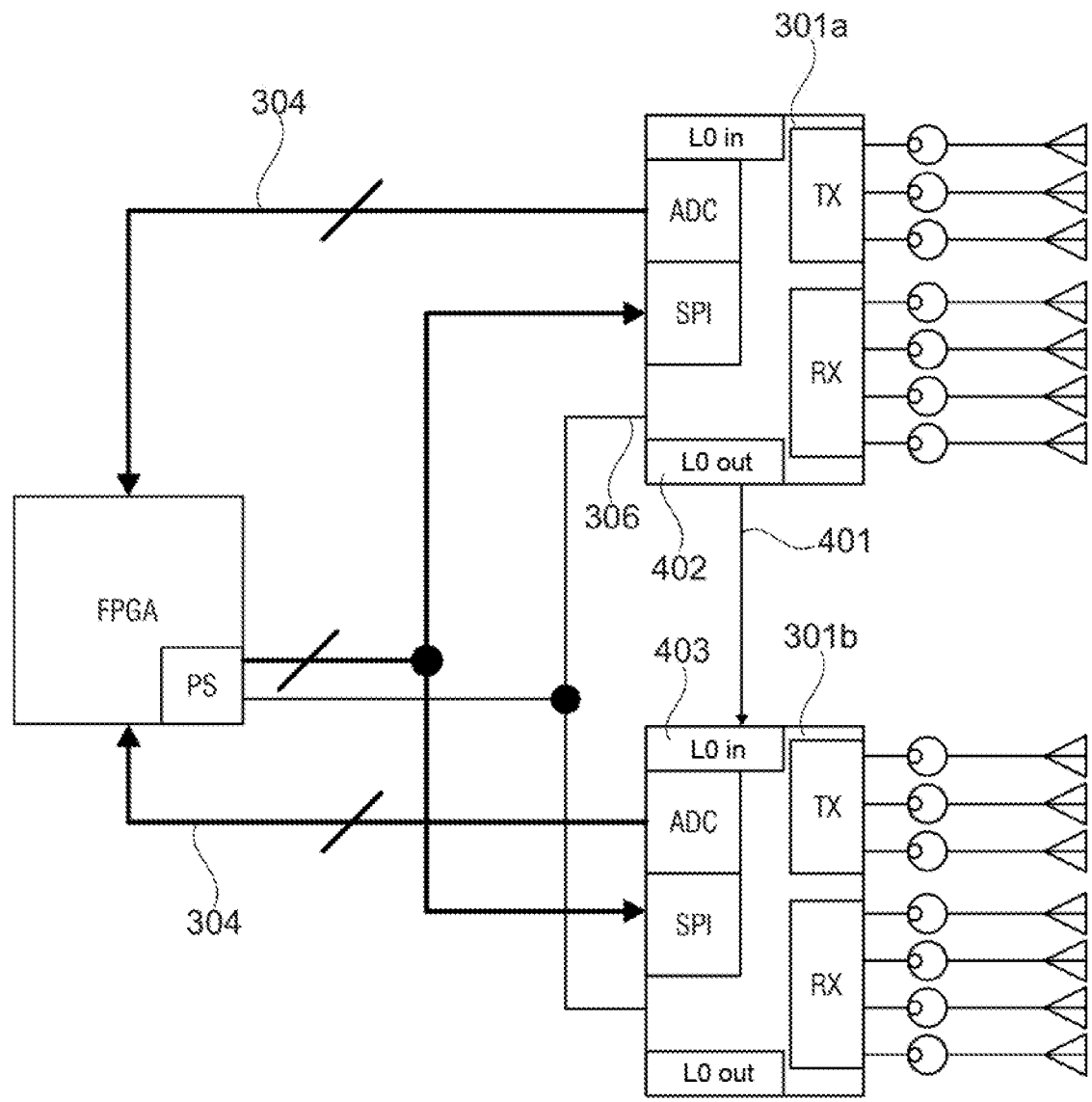
FIG. 4A shows the structure of a further radar fill level measurement device that has two radar chips.
Figure 4B:
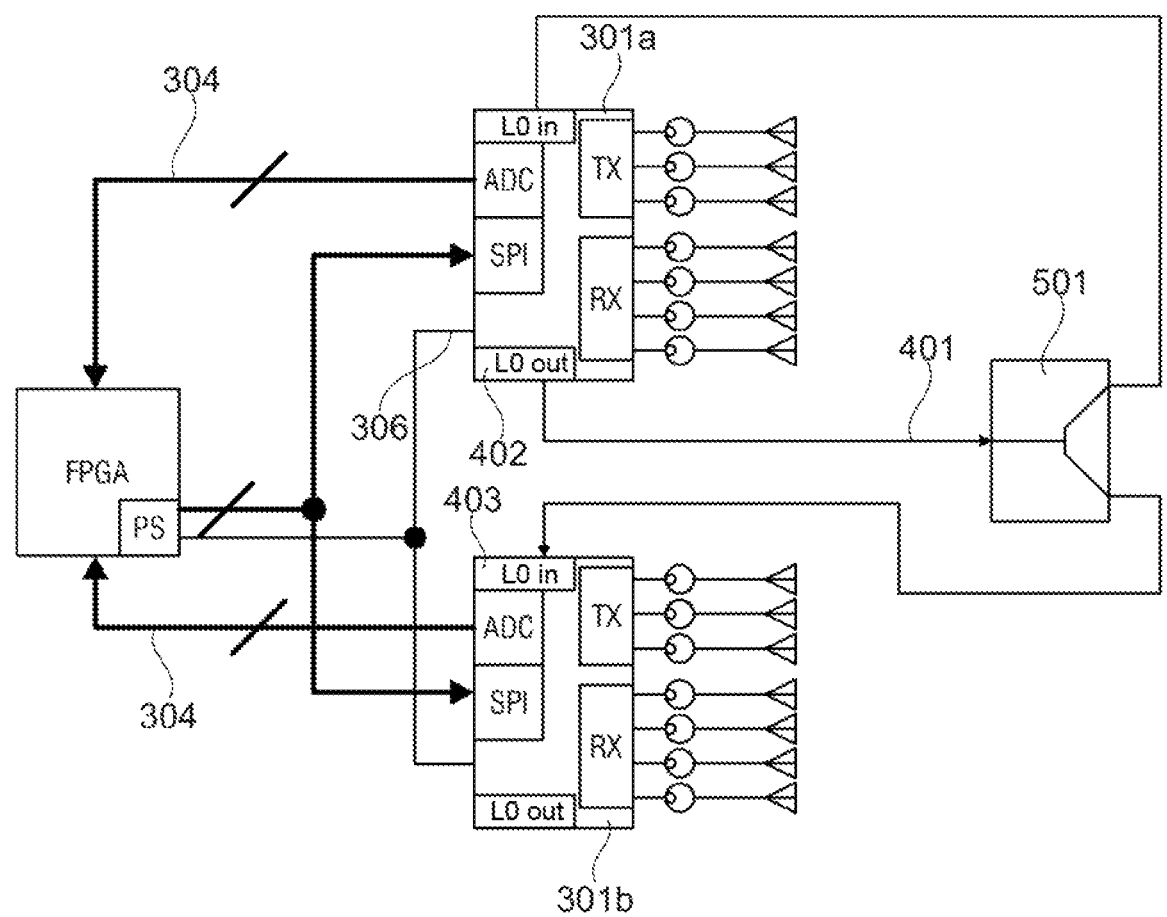
FIG. 4B shows the structure of a further radar fill level measurement device.

The radar fill level measurement device comprises a plurality of highly integrated radar chips (RSoCs, radar system-on-chips) 301 (see e.g. FIG. 4A) that have a plurality of transmitters and receivers. These can also be used in fields such as driver-assistance systems, traffic monitoring, object monitoring in industrial plants, drones and many other fields. One advantage of multi-channel radar chips 301 is that a type of beamforming can be carried out. Conventional radar devices for the above-mentioned uses sometimes require one to four radar chips 301 in order to meet requirements.

Said RSoCs 301 can also be used for fill level measurement. FIG. 1A shows a fill level measurement device 101 that records the topology of a filling material surface by scanning the surface of bulk materials in order to thus obtain more information regarding the actual fill level and the volume thereof than would be obtained during a conventional fill level measurement process.

A challenge here is that just small beam widths are required even at a large distance, which is associated with a large antenna aperture.

Figure 1B:
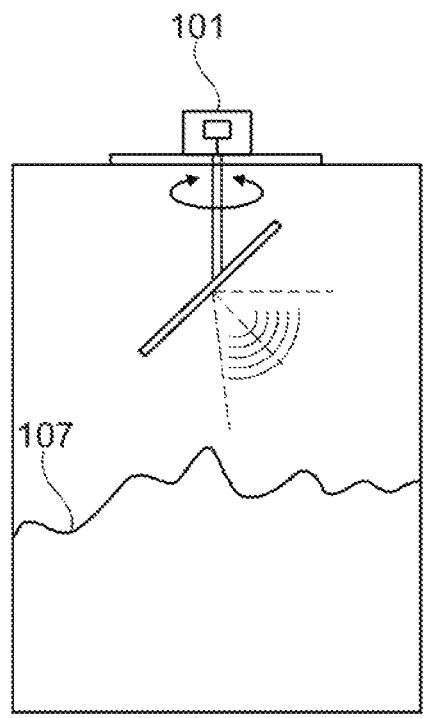
FIG. 1B shows a further radar fill level measurement device.
Figure 1C:
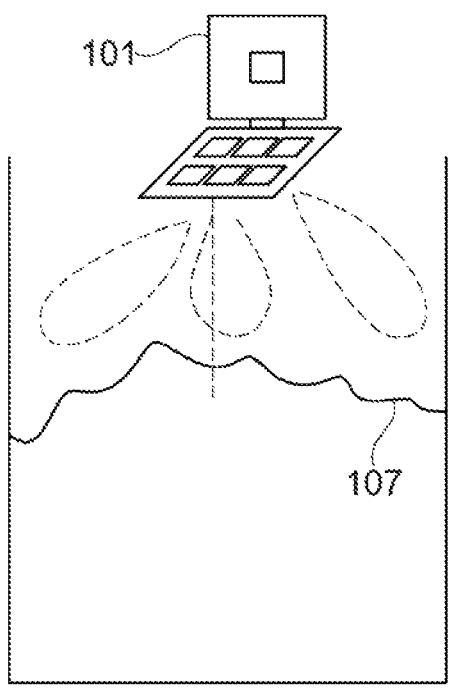
FIG. 1C shows a further radar fill level measurement device.

One option for achieving this is to mechanically pivot a single-channel radar device (FIG. 1A) in order to thus scan the surface. Another option is to use systems that are already semi-mechanized (FIG. 1B). In this case, a combination of analog or digital beamforming is combined with mechanical pivoting. These systems have disadvantages with regard to sturdiness. Mechanical components are liable to require maintenance in harsh process conditions and are expensive to produce. Fully electronic beamforming (FIG. 1C) is therefore an option.

Figure 2:
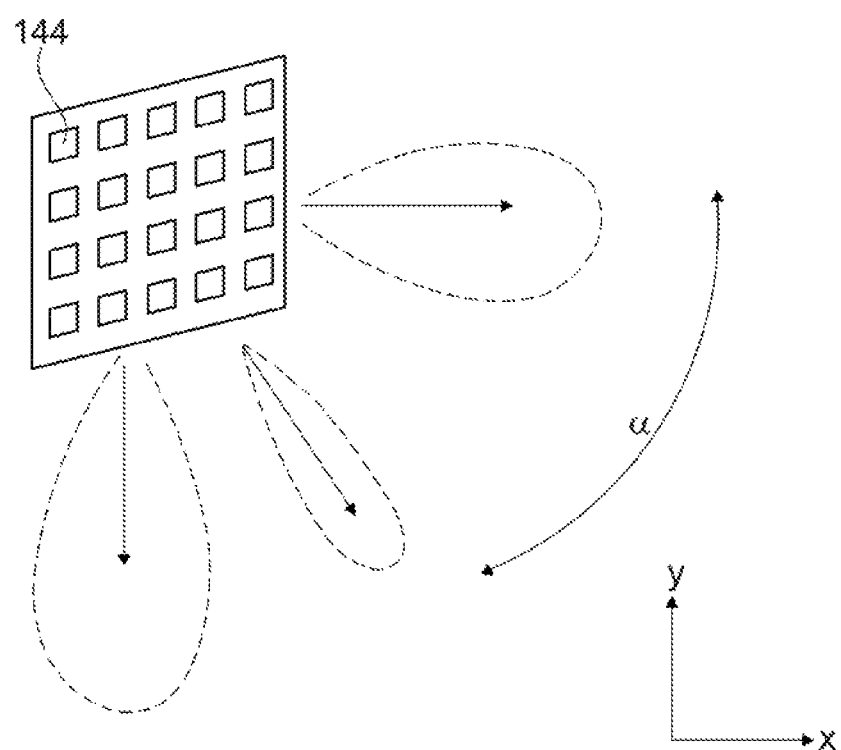
FIG. 2 shows an array antenna of a radar fill level measurement device.

In order to achieve comparably large antenna apertures using these beamforming radar systems, it is necessary to provide a large number of transmitters and receivers. The disadvantage of fully electronic beamforming is that it requires the use of many antennas having relatively small individual apertures. Furthermore, transmitters and receivers, which are typically each provided with an antenna element 144, 303, have to be aligned in two dimensions (x and y direction) (FIG. 2).

Therefore, more transmitters and receivers are typically required for topology-recording fill level measurement technology than for other uses, which can result in a number of chips higher than four.

The topology-recording radar fill level measurement devices usually comprise a plurality of transmission and reception antennas. These systems are also brown as MIMO systems (multiple input, multiple output). Particular methods of digital beamforming make it possible to digitally influence the directivity of the transmission and reception group antennas on both the transmission side and the reception side, as a result of which the filling material surface can be scanned. These fill level measurement devices have hitherto used a plurality of discrete high-frequency components for each transmission and reception channel, such as mixers, low-noise amplifiers, couplers, frequency multipliers, voltage-controlled oscillators etc., and also discrete analog-to-digital converters, phase-locked loops, voltage regulators, filters, amplifiers and other low-frequency components. This characteristic can make MIMO systems complex, large and expensive.

New, highly integrated radar chips 301 have already fully integrated many of the above-mentioned components in one chip 301. The following are integrated: PLLs, VCOs, mixers, ADCs, filters, control units, SPIs, amplifiers, switches and voltage regulators. A large amount of space can thus be saved on a printed circuit board. Said chips 301 also offer another advantage with regard to cost, since they are cheaper than a discrete structure comprising a plurality of different individual components. The MIMO chips 301 have three transmitter stages and four reception stages, for example. A possible transmission frequency region may be between 55 and 65 GHz, or between 75 and 85 GHz, for example.

The radar chips 301 can be parameterized by means of a digital interface (having an associated bus 305) (SPI, I$^2$C, etc.). Various parameters can be set or read out in order to adjust the modulation type, bandwidth, frequency range, scanning frequency, IF filter characteristics (intermediate-frequency signal), etc.

The analog IF signals that contain information regarding distances and angles of objects from the monitoring region are typically also still digitized on the radar chip 301 for further signal processing.

The radar method according to which said radar chips 301 typically operate is a specific frequency-modulated continuous-wave radar method (FMCW method). However, not only one frequency ramp is modulated during a measurement process, but rather a plurality of frequency ramps are modulated in succession which are in a fixed temporal relationship with one another. The number of ramps per measurement can be 128, for example. The combination of said 128 ramps is referred to a frame.

Clever signal processing algorithms also allow speeds of a plurality of objects to be determined, in addition to distances. The ramp duration is very short in comparison with the conventional FMCW method, and is typically in the range between 10 and 500 µs per ramp. Since the HF bandwidth of the transmission signals can be in the range between several hundred megahertz and four (or more) gigahertz, the intermediate-frequency signal should be digitized at a high sampling rate.

The combination of high HF bandwidths and short ramp durations results in a high sampling rate during the analog-to-digital conversion.

The interface for the digitized output signals is usually a fast, series-connected, differential digital interface 304 such as LVDS or CSI2. In an example of a radar chip 301 comprising four reception channels, the digital interface of the radar chip 301 has four LVDS or CSI2 interfaces by means of which the digitized intermediate-frequency signal is transmitted. Said digital interfaces also use an additional differential clock signal that is required at the receiver of the digitized data for synchronizing the interfaces. Depending on the interface, further signal lines are also required in order to mark the beginning and/or end of the data packets.

Figure 3:
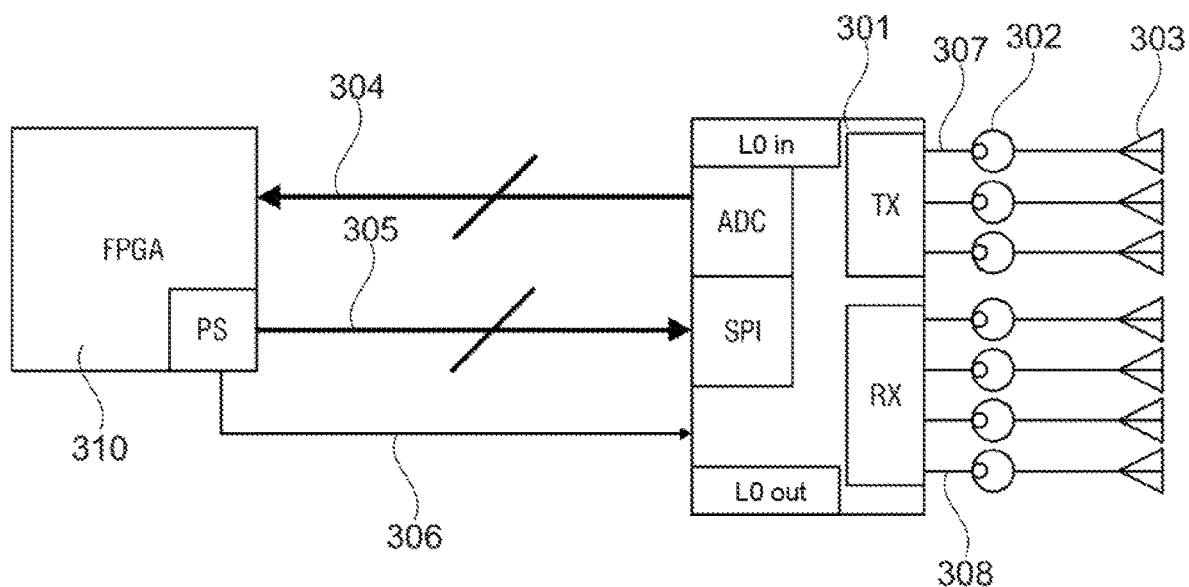
FIG. 3 shows the structure of a radar level measurement device that has one radar chip.

If the radar chip 301 nonetheless provides too few transmission and reception channels 307 (FIG. 3) for the desired application, said chips (301) offer the option of cascading, i.e. a plurality of chips being combined to form a synchronized radar unit. It is thus possible for transmitters to transmit simultaneously using a synchronous signal, and/or for receivers to receive synchronously, despite being physically located on different RSoCs.

This is possible because, in addition to various clock synchronization lines, a high-frequency signal is distributed on a high-frequency line, arrangement 401 from a synchronization circuit 402 of a first chip 301a to the synchronization circuits 403 of other chips 301b. The high-frequency signal is referred to as a local oscillator signal (LO signal) and, in terms of the frequency range, is a signal that is divided by an integer factor with respect to the transmission frequency range. Division factors of two or four, but also other integer division factor, are possible. For example, if the radar chip has a transmission frequency range of approximately 80 GHz, then the LO signal can have a frequency range of approximately 20 GHz or 40 GHz.

The chip that provides the high-frequency signal is referred to as the master 301a. The chips that receive the high-frequency signal are referred to as slaves 301b.

For example, a cascaded radar system containing four radar chips (FIG. 5), which in turn each comprise four reception channels, has sixteen digital interfaces by means of which the associated intermediate-frequency signals (measurement data) are transmitted.

In order to process said digital measurement data, the radar chips usually use specially adapted signal processors which, however, have a strictly limited number of digital interfaces. Units for digital signal processing can be integrated in the radar chip itself, although this is of only limited use or cannot be used at all for cascading radar chips and in the context of radar-based, topology-recording fill level measurement.

In order to avoid these problems, it is therefore proposed to use an FPGA module (field-programmable gate array) (FIGS. 3, 4A, 4B and 5) instead of the specially adapted signal processor. These modules, which can be used universally, can be obtained from a limited number of manufacturers in various embodiments. The FPGA receives the digitized values of the intermediate-frequency signal and takes over computing operations such as averaging, windowing or calculating FFTs (fast Fourier transforms).

An advantage of the combination of radar chips and an FPGA is a flexible combination of eight or more radar chips that would not be possible with a specially adapted signal processor such as that used in the automotive industry. Cascading such a large number of radar chips makes this technology of interest to fill level measurement technology.

If a far greater number of radar chips is required, it is also conceivable to use a plurality of FPGAs and to then synchronize said FPGAs with one another.

The FPGA advantageously contains, in addition to the programmable logic cells, an integrated processor system (PS) that can take over control tasks such as parameterization of the radar chips, energy management, control of a display or communication with a computer or a process control station by means of a network. The processor system can also signal the start of a measurement by means of a digital line 306.

Furthermore, the processor system can take over signal-processing tasks such as those known from existing fill level radar measurement devices, e.g. searching for echoes, suppressing interfering echoes, etc.

Depending on the type of radar chip and FPGA, it may be necessary to adjust the level of the digital interfaces. A specially adapted resistance network or an adapter chip can be used for this purpose.

Since the digital interfaces by means of which the digitized IF signal is transmitted usually consist of one differential pair of conductors per channel, it is necessary to provide discrete line-termination resistors, depending on the FPGA. Said resistors usually have a value of 100 ohm.

Another component that can be used advantageously is an amplifier (or a plurality thereof) that has an integrated splitter for low-frequency signals that signal the start of a measurement, starting at the master. The master transmits this signal and distributes it to all the slaves. It is important for the lines to be approximately the same length, so that there are no temporal offsets in the individual radar chips.

Since a large number of radar chips can be cascaded in this way, the output stage of the LO signal may not provide sufficient output power to operate all the radar chips. One problem with distributing the LO signal to the high-frequency line 401 is that high-frequency lines have non-negligible path loss. Since the radar chips 301 on the printed circuit board 904 are usually spaced apart from one another by several centimeters (ranging from 5-10 cm), the high-frequency lines 401 that guide the LO signal have to be at least just as long. A typical microstrip line on a standard high-frequency substrate can have an attenuation of from 0.5 to 2 dB/cm. This depends predominantly on the substrate and on the frequency. In contrast, waveguides can be designed to have a far smaller path loss. For this reason, it is expedient to couple the LO signal into a waveguide after the signal has been coupled out of the printed circuit board 904 by means of a microstrip line, so as to cause fewer losses on the path to the adjoining chip (shown schematically in FIG. 11).

Figure 6:
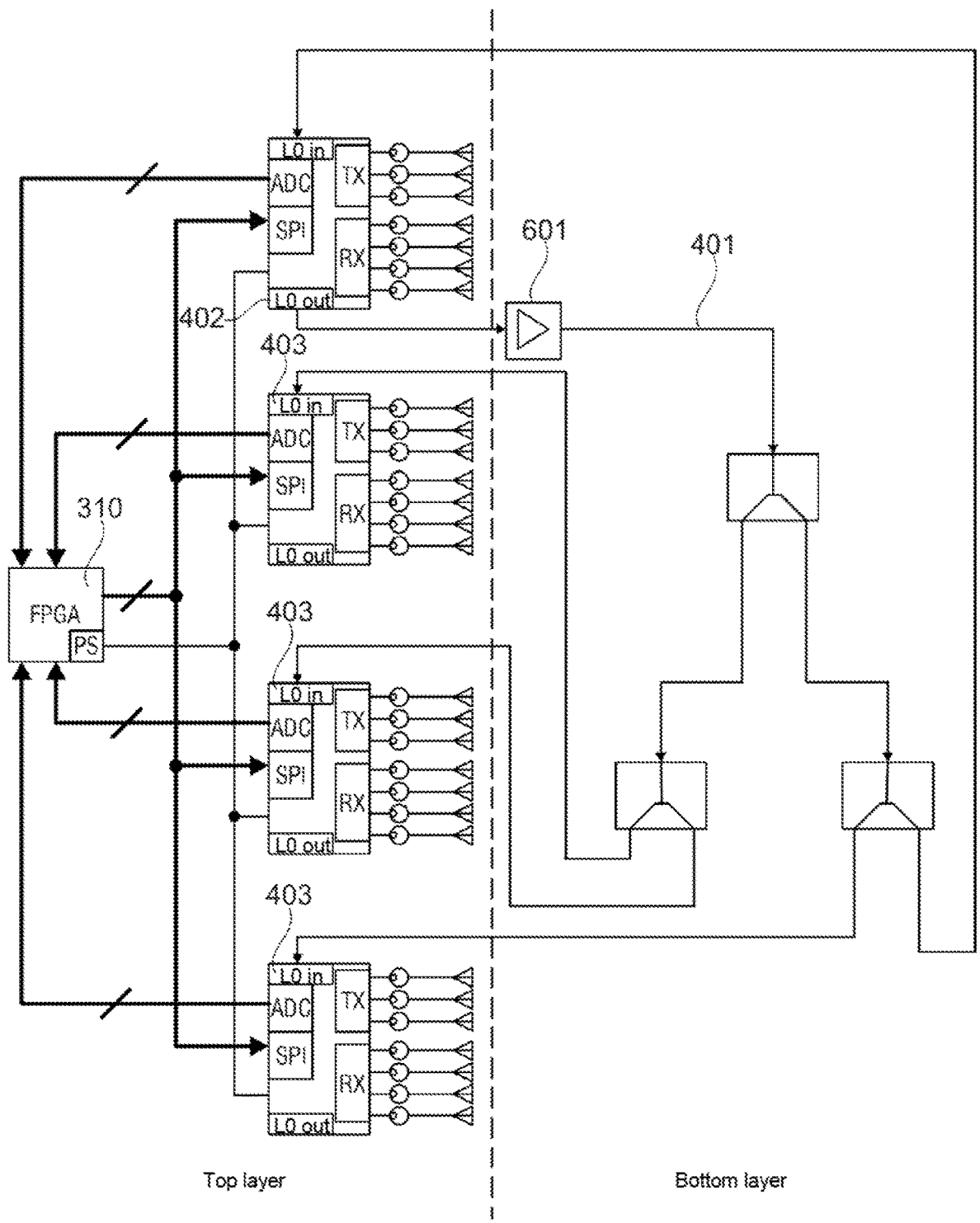
FIG. 6 shows the structure of a further radar fill level measurement device.
Figure 7:
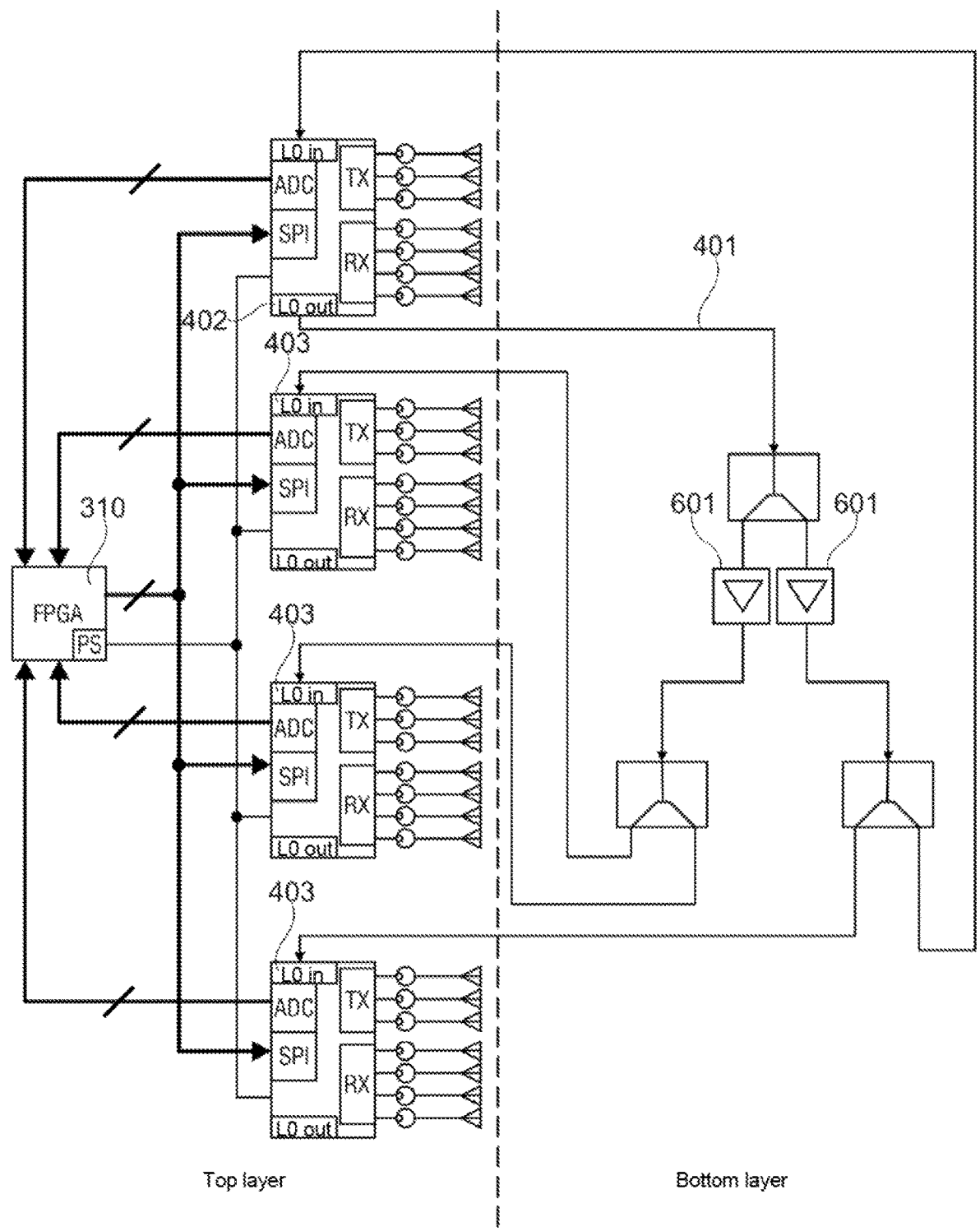
FIG. 7 shows the structure of a further radar fill level measurement device.

Another option is to amplify the HF power of the LO signal on the high-frequency line 401 by using one or more external high-frequency amplifiers 601 (FIGS. 6 and 7). Said amplifiers advantageously have a low noise figure because they have a direct effect on the system performance. Low-noise amplifiers (LNAs) are therefore proposed for this purpose.

The LNAs are active components that have a separate power supply. Said LNAs are advantageously disconnected between the radar frames and/or in transmission breaks so as to save energy and so as to prevent the device overheating.

Moreover, it should be ensured that the LNAs are operated in the linear range thereof which means that the input power of the high-frequency signal is not too high. Otherwise, signal distortions can occur. Owing to the technology, the output power of semiconductor components is typically at 80 GHz between 8 and 15 dBm, without substantial signal distortions occurring.

Supplying a high-frequency amplifier 601 having 20 dB gain with a high-frequency signal having a power of 15 dBm would theoretically result in an output power of 35 dBm. However, since the high-frequency amplifier 601 would then no longer be operating in the linear range thereof, undesirable signal distortions would occur. It is therefore necessary to first bring the LO signal into a power range that allows the high-frequency amplifier 601 to operate in the linear range thereof. It is possible to parameterize, and thus attenuate, the LO output power of the radar chip 301. Likewise, a long high-frequency line can also attenuate the output power.

It is also possible for the high-frequency amplifiers to be used only after the LO signal has been split by means of a high-frequency power divider and the power of said signal has thus been reduced. This is the case when a plurality of slaves 301b are used, or when, depending on the radar chip 301, the LO signal has to be returned to the master 301a.

A plurality of amplifiers can be used, as in FIG. 7. Since an amplifier also has a finite signal transit time, the amplifiers are advantageously positioned such that substantially the same signal transit time is set for all the lines.

Since the LO signal is a high-frequency signal, waveguides, microstrip lines 903 and/or SIW (substrate integrated waveguide) lines 1002 (FIG. 10) are advantageously used. Power dividers 501 (e.g., Wilkinson dividers) and/or couplers 501 (e.g. rat-race couplers or magic Ts 1401) can also be used for advantageously splitting the power.

Figure 5:
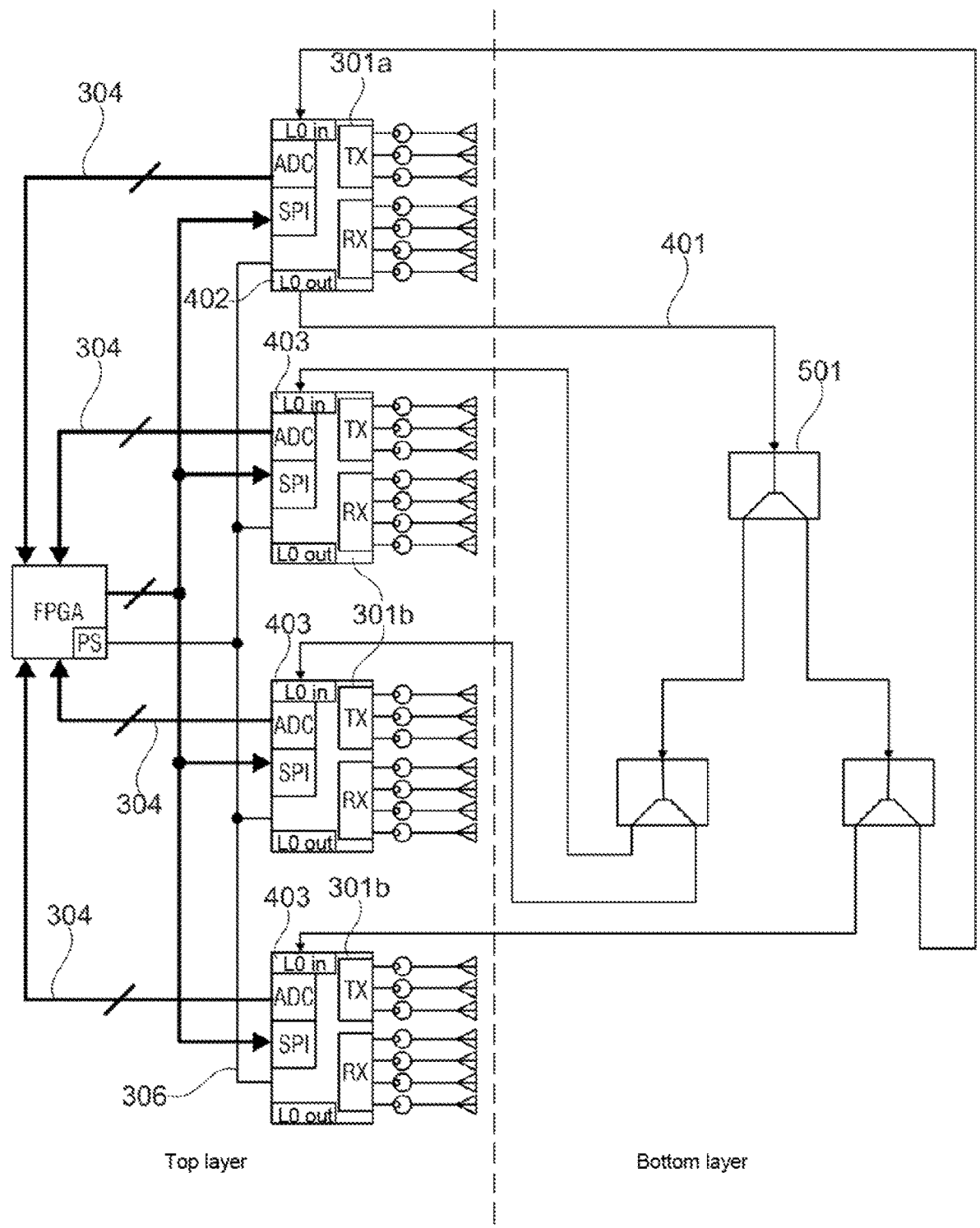
FIG. 5 shows the structure of a further radar fill level measurement device.
Figure 13A:
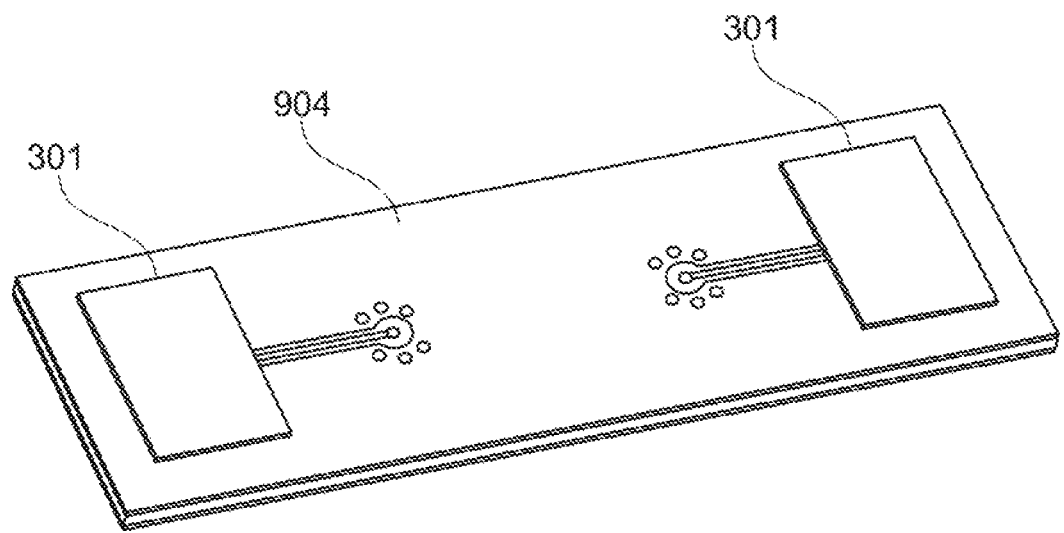
FIG. 13A is a plan view of a further high-frequency line arrangement.
Figure 13B:
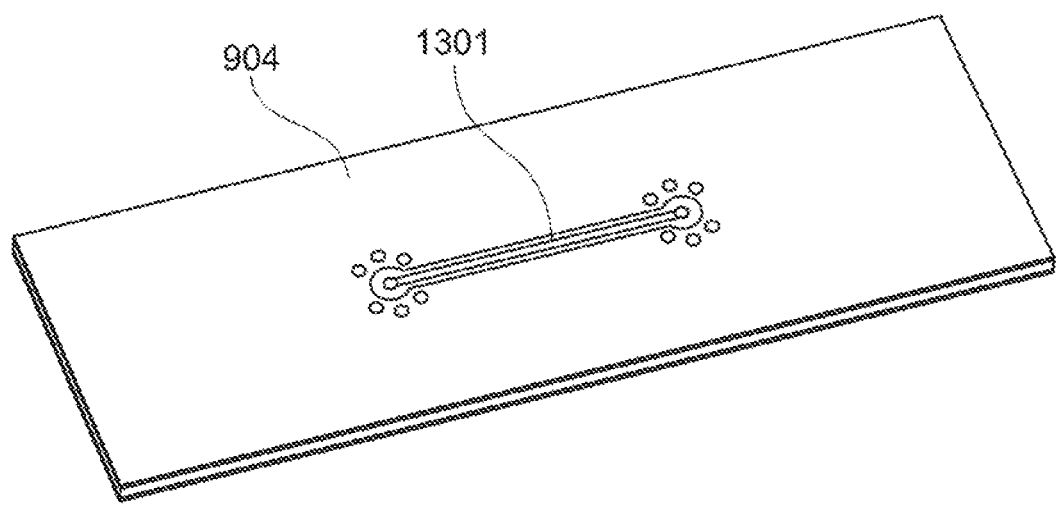
FIG. 13B shows the bottom face of a printed circuit board of the line arrangement from FIG. 13A.

The radar chips 301 are advantageously positioned on one side of the printed circuit board 904, and the high-frequency line 1301, which can be the largest part of the high-frequency line arrangement 401, is arranged on the other side of the printed circuit board, such that the LO signal is split and distributed on the other side of the printed circuit board 904, as is shown in FIGS. 5 to 7 and in FIG. 13A and 13B. The reason for this is described below.

The radar chips usually contain nine or ten signal inputs and signal outputs of which the frequency range is in the two-figure gigahertz range. When cascading the radar chips, in addition to the lines to the transmission and reception antennas, the LO signals also have to be routed from chip to chip. This plurality of signal lines means that crossing of signals is often unavoidable.

Figure 8:
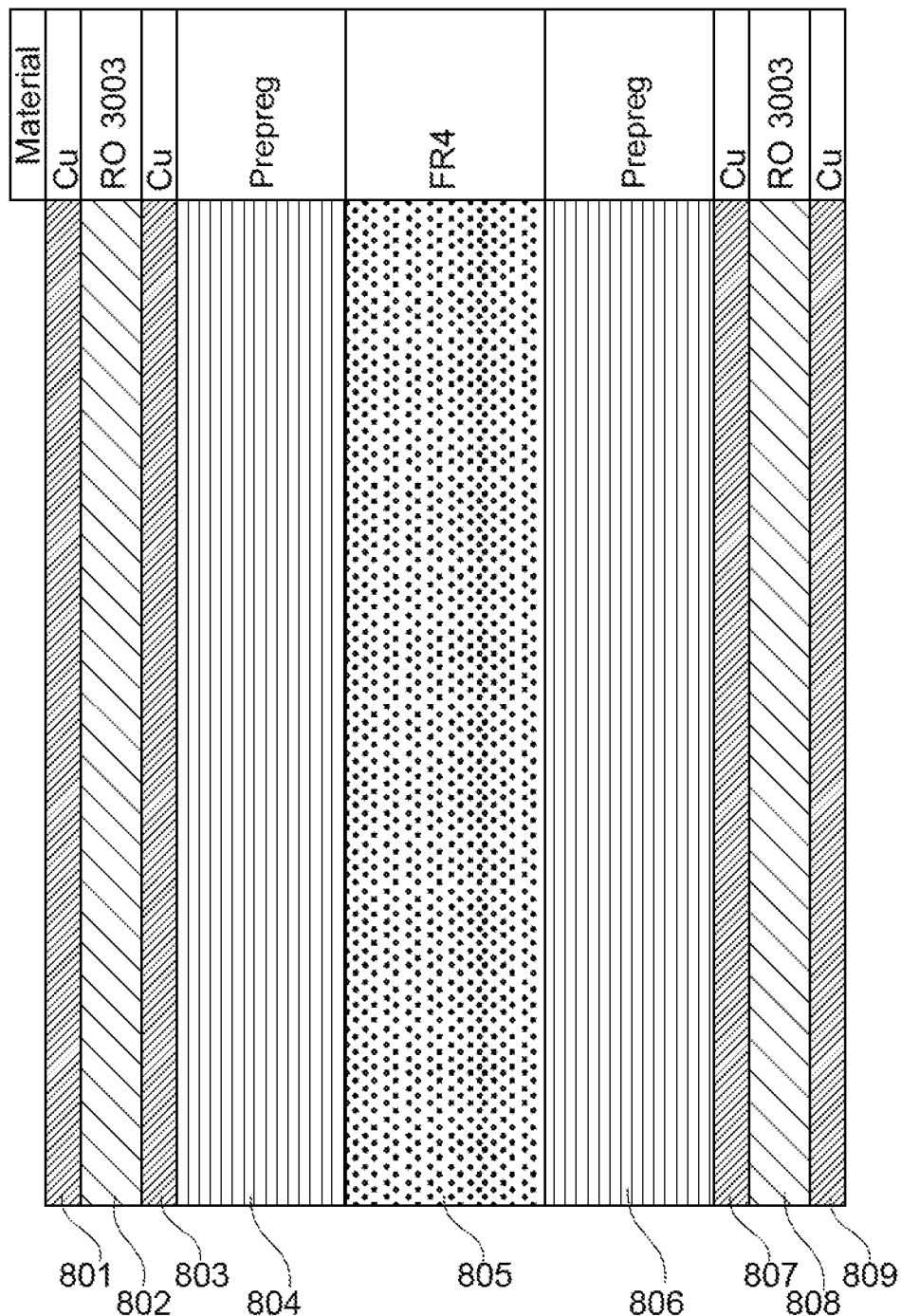
FIG. 8 shows a printed circuit board layer structure.

However, since it is not possible for signal lines to cross on a printed circuit board 904, the signals are typically conducted by means of vias into other internal printed circuit board planes (inner layers) 803, 807, and guided past one another there. A typical printed circuit board layer structure can be seen in FIG. 8, in which a plurality of substrates are bonded to one another by means of an adhesive film 804, 806. However, the inner layers of printed circuit boards 904 are usually standard substrate materials 804, 805, 806 and are not suitable for high-frequency signals. For reasons of cost and stability, in particular often only one, or both, of the outer substrate layers 802, 808 of a printed circuit board 904 are made of a substrate material that is specifically optimized for high-frequency technology (e.g. Rogers RO3003). High-frequency substrates are generally soft and need to be very thin, e.g. 127 μm, for high frequencies.

Figure 9A:
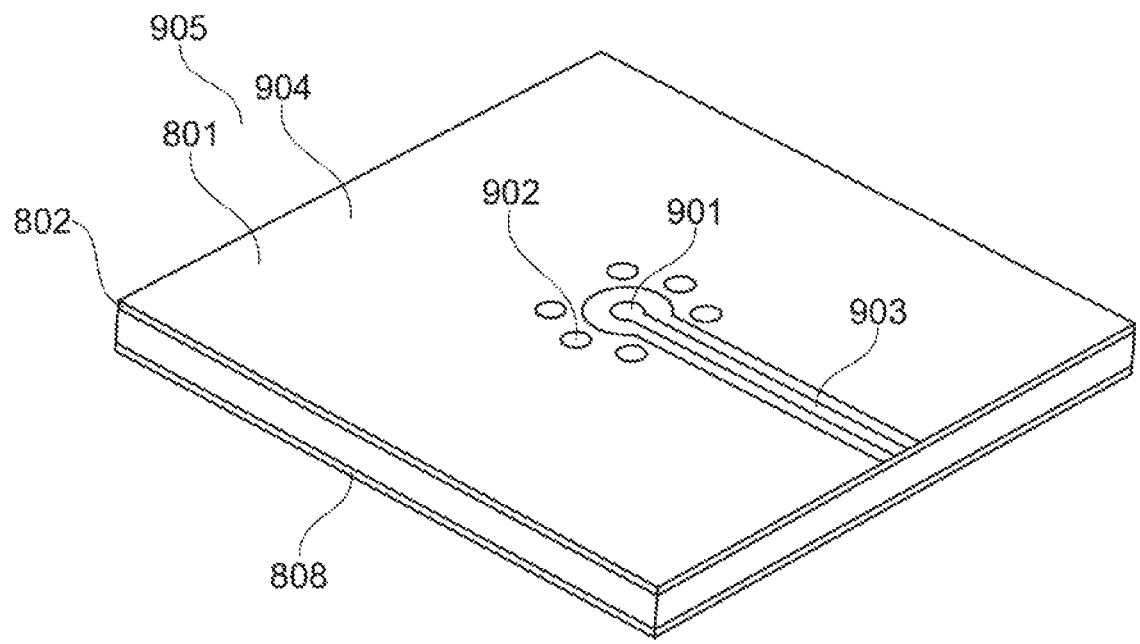
FIG. 9A shows a via arrangement of a radar fill level measurement device.
Figure 9B:
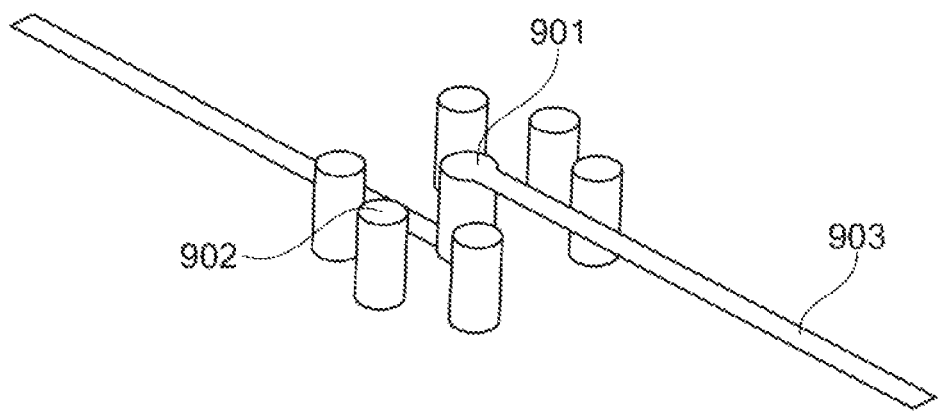
FIG. 9B shows the metallized elements of the via arrangement from FIG. 9A.

For these reasons, it is proposed to guide the LO signal by means of special line structures and via arrangements from the chip-side plane of the printed circuit board to the rear side, and to split, optionally amplify and distribute said signal there, and then cause it to re-emerge on the chip-side plane of the printed circuit board. Special line structures and via arrangements of this type can be seen in FIGS. 9A and 9B (FIG. 9B shows the line and the vias without the substrate materials and copper surfaces). Other, secondary vias 902 are positioned at a constant radius around the main via 901, thus forming a kind of coaxial printed circuit board feedthrough. The via diameter and the distance from the main via largely determine the impedance of the feedthrough, and need to be adapted to the frequency range being used, for example 40 GHz.

An alternative option for routing the LO signals without the lines crossing is to couple the signal into a waveguide or into a coaxial cable and to construct the waveguide or coaxial cable such that the lines pass by one another. For coupling into a waveguide for example, a transition from the microstrip line to the waveguide 1101 is necessary.

Figure 10A:
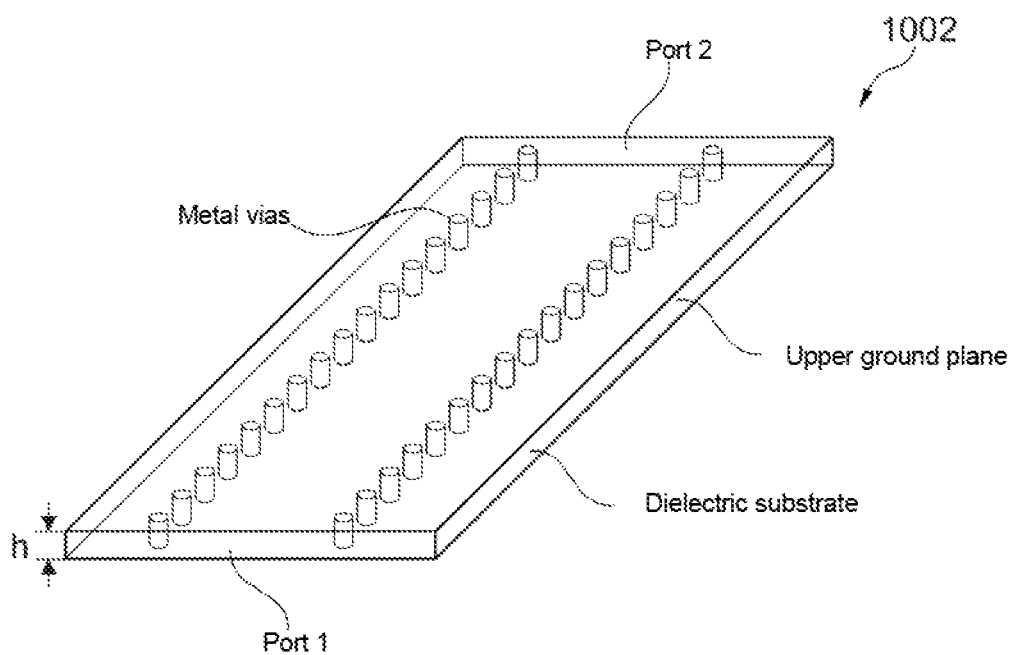
FIG. 10A shows a detail of a high-frequency line arrangement.
Figure 10B:
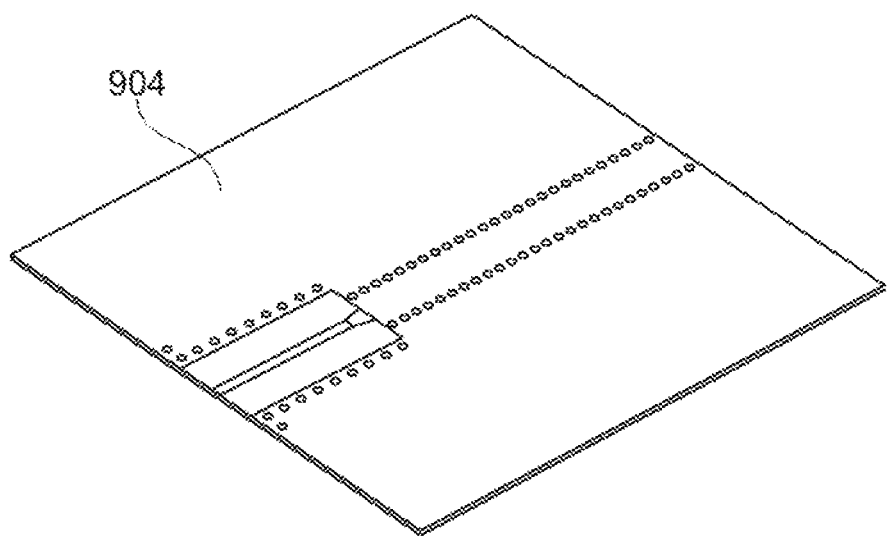
FIG. 10B shows a detail of a further high-frequency line arrangement.
Figure 10C:
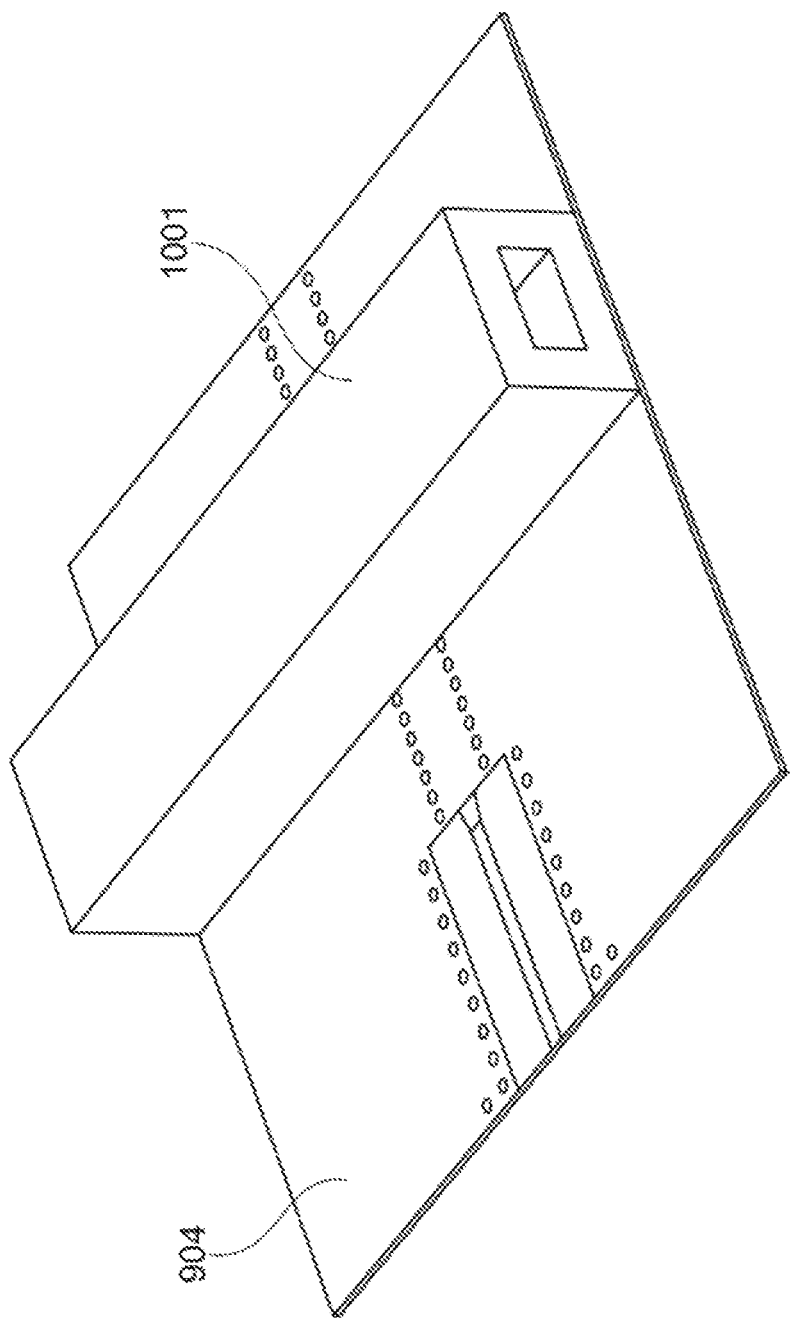
FIG. 10C shows a detail of a further high-frequency line arrangement.
Figure 12:
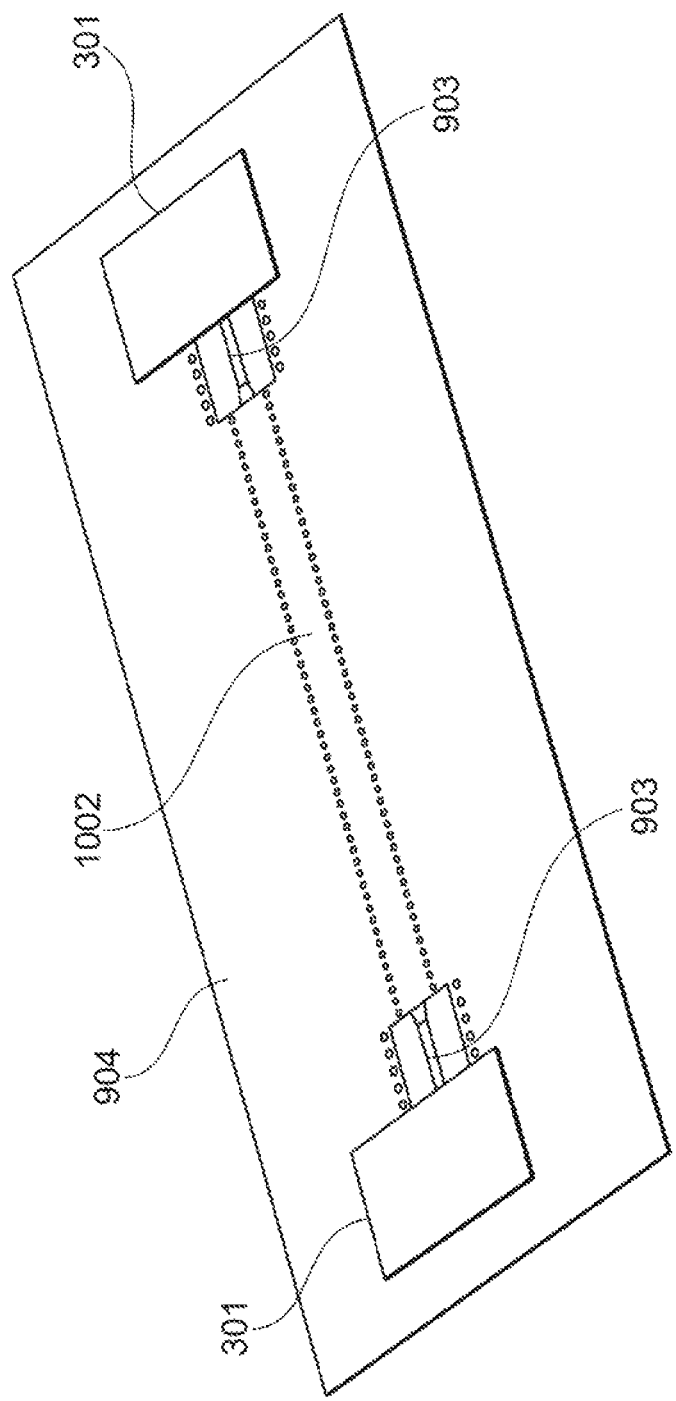
FIG. 12 shows a further high-frequency line arrangement.

Another useful type of line is the substrate integrated waveguide (SIW) (FIG. 10A). This type of line is advantageously used when, for example, a waveguide 1001 directly abuts a printed circuit board 904 on which an LO/HF signal needs to be routed through beneath the waveguide by means of a microstrip line. Since the waveguide is usually made of a metal, it would short-circuit the microstrip line, making it impossible to transmit a signal. The SIW offers advantages in this case because it comprises a pure metal surface on the top face of the printed circuit board, and it makes no difference whether a waveguide is positioned thereon (see FIG. 10C). A transition from microstrip line technology to an SIW is shown in FIG. 10B.

The signal then has to be coupled into a microstrip line on the printed circuit board 904 again, so that said signal can be routed into the radar chip.

Radar fill level measurement devices are distinguished by robust antenna apparatuses that work even in harsh process conditions such as high and low pressures, high and low temperatures, dirt, dust, humidity, fog, etc. Furthermore, the antennas also need to protect the electronics from the above-mentioned influences, and are often built such that they also exhibit other safety-critical features such as explosion protection.

This characteristic can therefore also be implemented in topology-recording radar fill level measurement devices. In contrast with radar devices in the automotive industry, in which requirements of this type are not as high, waveguides and horn antennas are often used in process measurement technology.

Furthermore, in systems for digital beamforming it is advantageous when one or more antenna elements have a spacing of ≤λ/2, where λ denotes the wavelength of the transmission signal. In such cases, it is necessary to use special waveguide couplers 302 in order to couple the signal from a printed circuit board into a (horn) antenna 303.

Another problem with topology-recording radar fill level measurement devices that have cascaded radar chips is that the above-mentioned antennas may only be arranged in specific patterns. An advantageous pattern would be a T-shaped or L-shaped arrangement of the antenna elements. In order to avoid long line lengths for the high-frequency signals, it is proposed to position the radar chips on the top and the bottom face of the printed circuit board so that the line lengths from the radar chip to the waveguide coupler are approximately the same for all the HF signals.

Figure 14A:
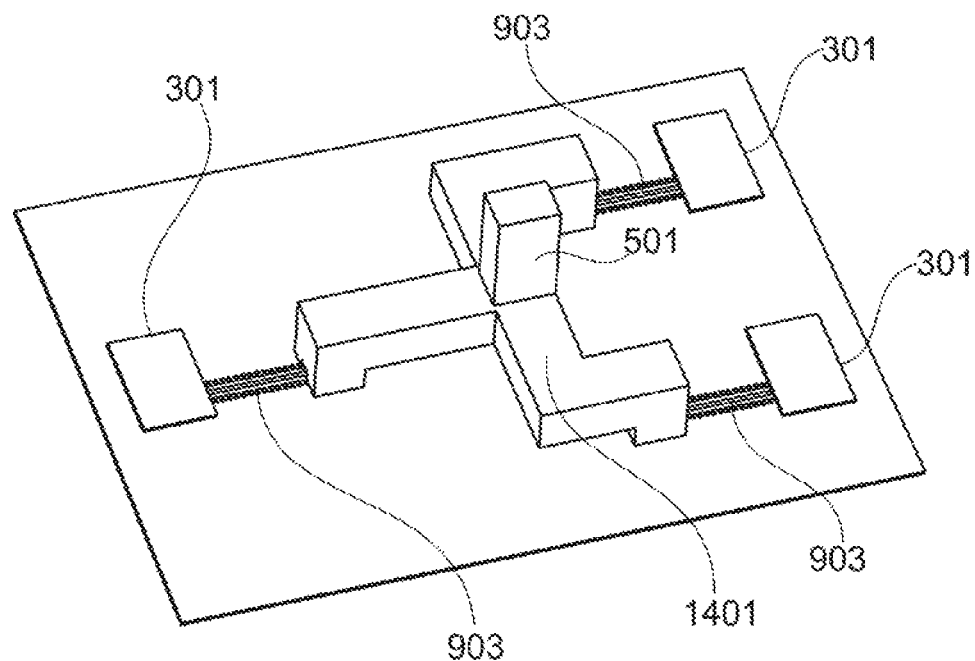
FIG. 14A shows a further high-frequency line arrangement having a waveguide and a power divider.

FIG. 14A shows a high-frequency line arrangement that conducts the high-frequency signal from the first synchronization circuit 402 (cf. FIG. 5) of the first radar chip to the corresponding synchronization circuit 403 of the slave chip, such that the master chip can synchronize the slave chips.

The line 903 that is bonded to the printed circuit board leads into a waveguide coupler, such that the high-frequency signal can then be guided further by means of the waveguide 1401. A high-frequency power divider 501 is provided in the waveguide 1401 and divides the high-frequency signal between two waveguides that lead into a high-frequency line 903 which is bonded to the printed circuit board and conveys the high-frequency signal to the relevant radar chip.

Figure 14B:
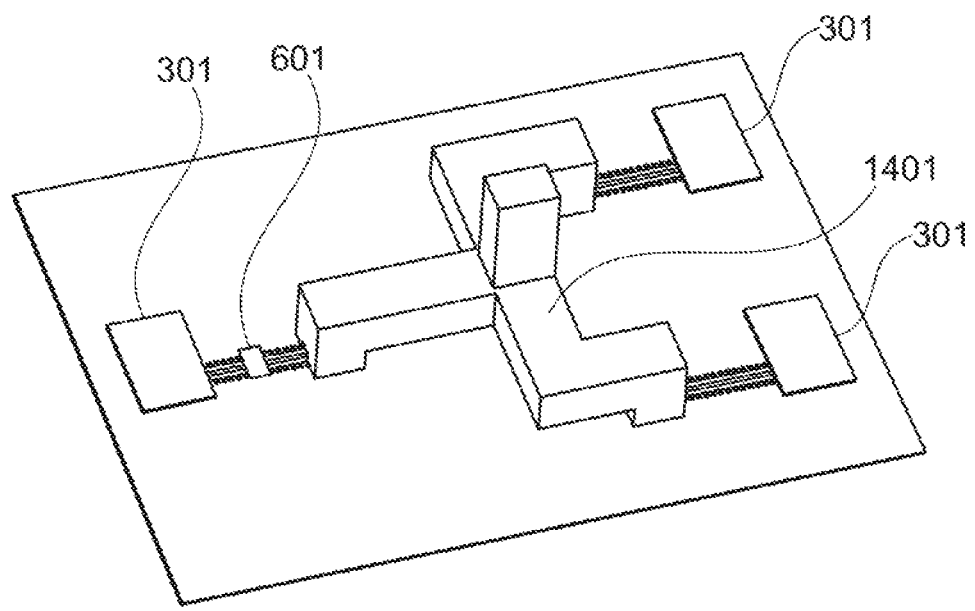
FIG. 14B shows a further high-frequency line arrangement having a waveguide, a power divider and an amplifier.

In contrast with FIG. 14A, in the embodiment according to FIG. 14B a high-frequency amplifier 601 is provided in the first line that is bonded to the printed circuit board in order to amplify the high-frequency signal before it is coupled into the waveguide 1401.

Figure 15A:
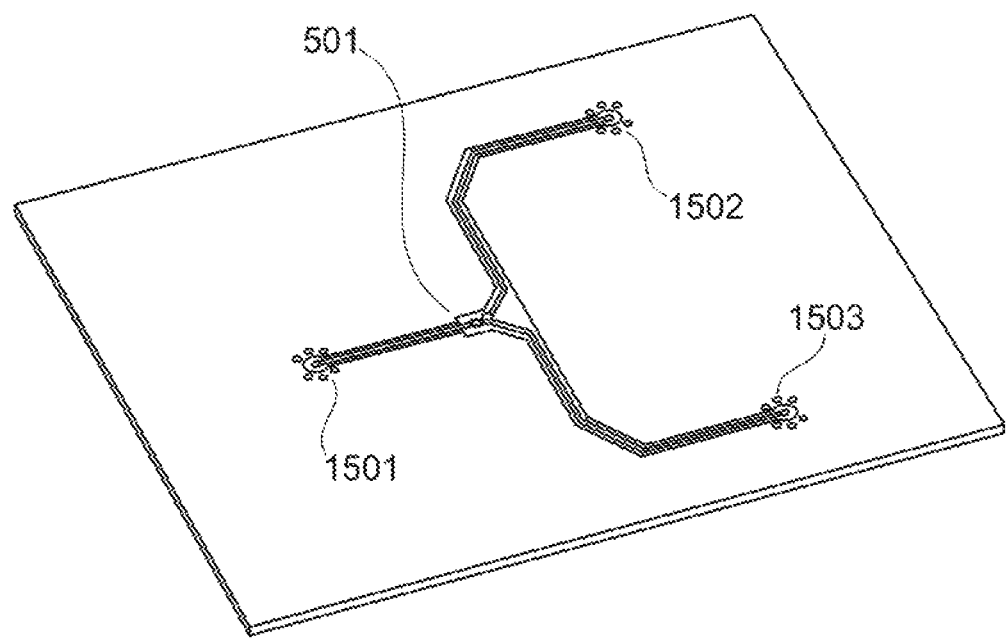
FIG. 15A shows a further high-frequency line arrangement having a power divider.

FIG. 15A shows a further embodiment of a high-frequency line arrangement on the top face of the printed circuit board, comprising a power divider 501. The starting point 1501 and the end points 1502, 1503 each comprise a via, as is shown in more detail in FIG. 9A and 9B.

Figure 15B:
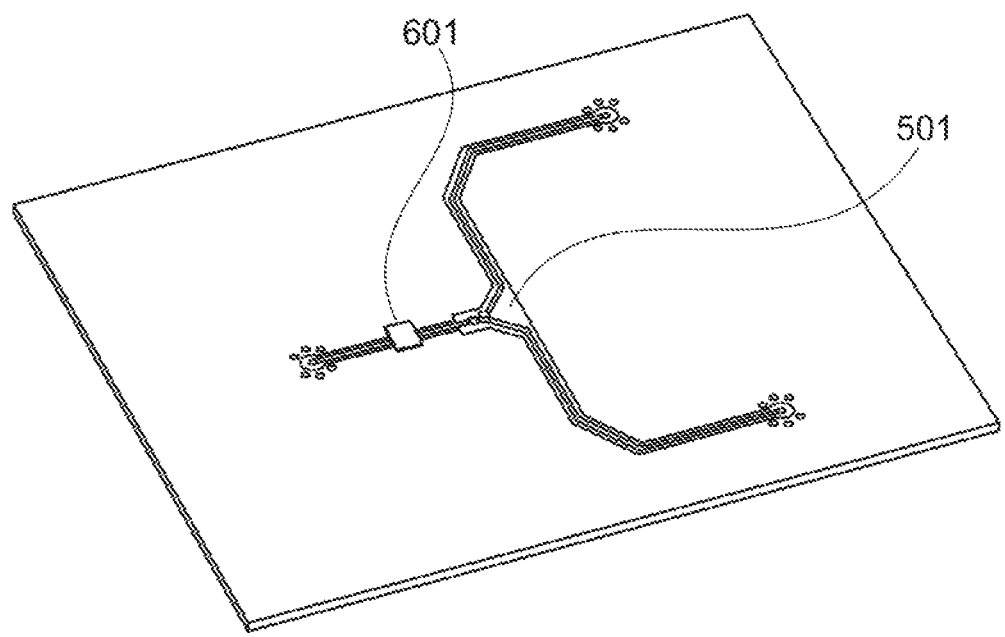
FIG. 15B shows a further high-frequency line arrangement having a waveguide, as power divider and an amplifier.

FIG. 15B corresponds to the embodiment in FIG. 15A, and additionally shows an amplifier 601 in flout of the power divider 501.

Figure 15C:
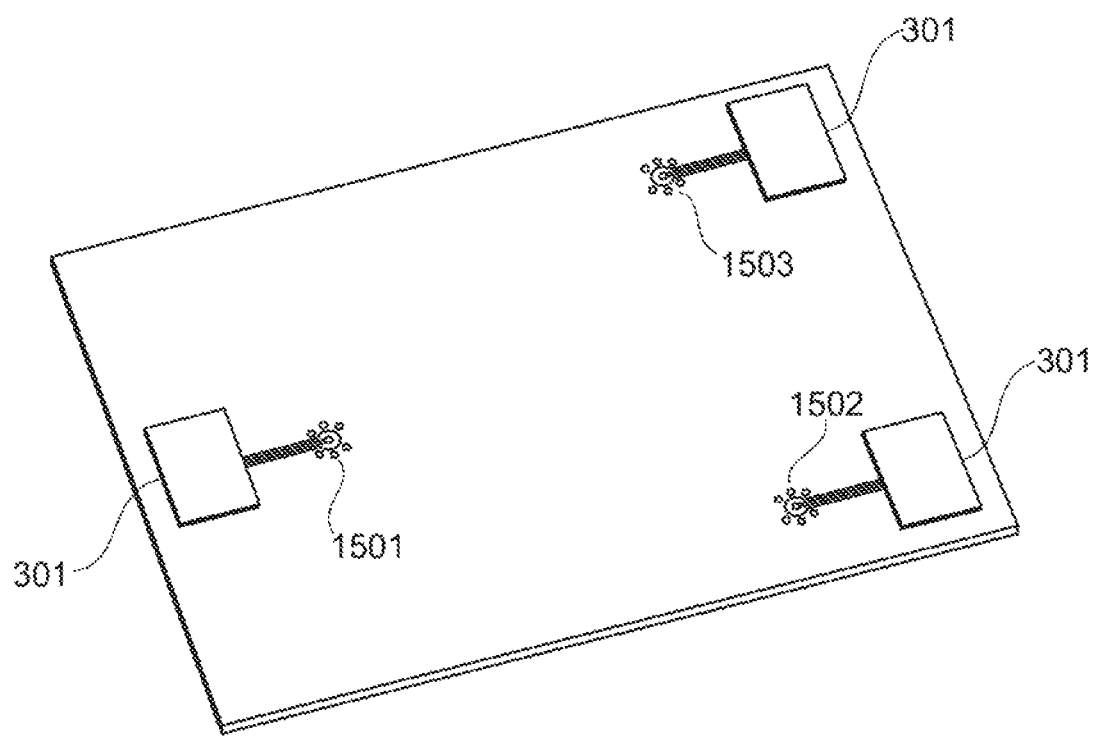
FIG. 15C shows the bottom face of the high-frequency line arrangements from FIG. 15A and FIG. 15B.

FIG. 15C shows the bottom face of the printed circuit boards from FIGS. 15A and 15B on which the radar chips 301 and the other lines that are connected to the synchronization circuits and lead to the vias shown in FIGS. 15A and B can be seen.

A core concept can be considered that of providing a radar fill level measurement device 101 that records the topology of the filling material surface and consists of a plurality of integrated radar chips 301, or at least comprises said chips, the radar chips 301 being synchronized with one another by means of a high-frequency signal (local oscillator signal) that is generated by a radar chip 301a and guided on a high-frequency line 401, the radar chips being positioned on the top face of the printed circuit board, and the local oscillator signal, after being coupled out of a microstrip line 903, being guided on the rear side of the printed circuit board by means of a coaxial via 905.

In addition, it should be pointed out that "comprising" and "having" do not exclude the possibility of other elements or steps, and "a" or "an" do not exclude the possibility of a plurality. It should also be pointed out that features or steps described with reference to one of the above embodiments may also be used in combination with other features or steps of other above-described embodiments. Reference signs in the claims should not be treated as limiting.

The invention claimed is:

1. A radar fill level measurement device for fill level measurement or for recording the topology of a filling material surface in a container, comprising:
   a printed circuit board having a first layer and a second layer;
   a first radar chip and a second radar chip that are each arranged on the first layer, wherein the first radar chip comprises a first synchronization circuit configured to generate a high-frequency signal and wherein the second radar chip comprises a second synchronization circuit; and
   a high-frequency line arrangement that is configured to synchronize the first and second radar chips by being configured to transmit the high-frequency signal from the first synchronization circuit to the second synchronization circuit,
   wherein the high-frequency line arrangement comprises a first conductive track on the first layer, a second conductive track on the first layer and a high-frequency line arranged therebetween on the second layer and connected to the first conductive track by a first via arrangement and to the second conductive track by a second via arrangement.

2. The radar fill level measurement device according to claim 1,
   wherein the high-frequency line comprises a third conductive track.

3. The radar fill level measurement device according to claim 1,
   wherein the high-frequency line comprises a waveguide.

4. The radar fill level measurement device according to claim 1,
   wherein the first conductive track and the second conductive track are microstrip lines.

5. The radar fill level measurement device according to claim 2, wherein the third conductive track is a microstrip line.

6. The radar fill level measurement device according to claim 1,
   wherein the high-frequency line arrangement configured to transmit the high-frequency signal comprises two or more different types of line which are arranged in series with one another.

7. The radar fill level measurement device according to claim 1,
   wherein the high-frequency line arrangement is split by a high-frequency power divider in order to synchronize a plurality of radar chips.

8. The radar fill level measurement device according to claim 7,
   wherein two lines that begin at the high-frequency power divider have a same signal propagation time until a split high-frequency signal reaches a synchronization circuit of a corresponding radar chip.

9. The radar fill level measurement device according to claim 1,
   further comprising a high-frequency amplifier that is arranged in the high-frequency line arrangement and is configured to amplify the high-frequency signal.

10. The radar fill level measurement device according to claim 1, wherein the high-frequency signal is a divided high-frequency signal that is divided by an integer factor with respect to a transmission signal.

11. The radar fill level measurement device according to claim 9,
    wherein the high-frequency amplifier has a frequency range of above 30 GHz.

12. The radar fill level measurement device according to claim 1,
    wherein an analog-to-digital converter is integrated in the first and in the second radar chip.

13. The radar fill level measurement device according to claim 1, further comprising circuitry configured to record the topology of a medium in a container.

14. The radar fill level measurement device according to claim 1,
    wherein the first radar chip and the second radar chip each comprise one or more transmission channels configured to emit one transmission signal in each case, and one or more reception channels configured to receive the transmission signals reflected by the filling material surface.

15. The radar fill level measurement device according to claim 1,
    wherein the fill level measurement device is configured as an FMCW fill level measurement device.

16. The radar fill level measurement device according to claim 1,
    wherein all measurement signals received by the radar fill level measurement device are processed only on the first layer.

17. A radar fill level measurement device, comprising:
    a printed circuit board having a first layer and a second layer;
    a first radar chip and a second radar chip that are each arranged on the first layer of a printed circuitry board; and
    a high-frequency line arrangement that is configured to synchronize the first and second radar chips by being configured to transmit the high-frequency signal from the first radar chip to the second radar chip,
    wherein the high-frequency line arrangement comprises a first conductive track on the first layer, a second conductive track on the first layer and a high-frequency line arranged therebetween on the second layer and connected to the first conductive track by a first via arrangement and to the second conductive track by a second via arrangement.

* * * * *